(12) United States Patent
Embleton et al.

(10) Patent No.: US 11,665,853 B2
(45) Date of Patent: May 30, 2023

(54) SYSTEM AND METHOD FOR SERVICE LIFE MANAGEMENT BASED ON CHASSIS CORROSION RATE REDUCTION

(71) Applicant: Dell Products L.P., Hopkinton, MA (US)

(72) Inventors: Steven Embleton, Austin, TX (US); Jon Taylor Fitch, Austin, TX (US); Joseph Danny King, Georgetown, TX (US); Sandor T. Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 384 days.

(21) Appl. No.: 16/938,595

(22) Filed: Jul. 24, 2020

(65) Prior Publication Data
US 2022/0030744 A1    Jan. 27, 2022

(51) Int. Cl.
*H05K 7/20* (2006.01)
*H05K 7/14* (2006.01)

(52) U.S. Cl.
CPC ....... *H05K 7/20209* (2013.01); *H05K 7/1488* (2013.01); *H05K 7/20836* (2013.01)

(58) Field of Classification Search
CPC ............ H05K 7/1488; H05K 7/20209; H05K 7/20745; H05K 7/20836
USPC ......................................... 700/300
See application file for complete search history.

(56) References Cited

U.S. PATENT DOCUMENTS

| | | | |
|---|---|---|---|
| 4,684,510 A | 8/1987 | Harkins | |
| 5,796,580 A * | 8/1998 | Komatsu | H05K 7/20727 361/679.48 |
| 6,138,056 A | 10/2000 | Hardesty et al. | |
| 6,885,554 B1 | 4/2005 | Reeck et al. | |
| 10,527,537 B2 | 1/2020 | Ter Horst et al. | |
| 10,912,218 B1 | 2/2021 | Cap et al. | |
| 2006/0150599 A1 | 7/2006 | Johnson et al. | |
| 2007/0064390 A1 | 3/2007 | Yeh et al. | |
| 2008/0122081 A1 | 5/2008 | Kim et al. | |
| 2011/0180421 A1 | 7/2011 | Borregaard | |
| 2013/0070409 A1* | 3/2013 | Hoss | G06F 1/20 165/104.21 |
| 2013/0265064 A1 | 10/2013 | Hamann et al. | |
| 2016/0095250 A1* | 3/2016 | Shelnutt | H05K 7/20718 361/679.49 |
| 2017/0089607 A1* | 3/2017 | Vichare | G06F 11/3058 |
| 2017/0350807 A1 | 12/2017 | Minamitani | |

(Continued)

FOREIGN PATENT DOCUMENTS

| | | | |
|---|---|---|---|
| CN | 205690636 U | * | 11/2016 |
| EP | 1729202 B1 | | 11/2007 |
| WO | 03070355 A1 | | 8/2003 |

*Primary Examiner* — Chun Cao
(74) *Attorney, Agent, or Firm* — Chamberlain, Hrdlicka, White, Williams & Aughtry

(57) ABSTRACT

A computing device of an information handling system includes a computing component and a chassis for housing the computing component. The computing components may be, for example, a portion of a circuit card, hardware device, or other physical structure. The chassis includes an air exchange for receiving gases for thermal management of the computing component and a corrosion management component, physically connected directly to the air exchange, that reduces a rate of corrosion of the air exchange due to the gases.

18 Claims, 13 Drawing Sheets

(56) References Cited

U.S. PATENT DOCUMENTS

| | | | |
|---|---|---|---|
| 2019/0257315 A1* | 8/2019 | Terraz | F24F 13/142 |
| 2019/0308121 A1 | 10/2019 | Gupta et al. | |
| 2019/0310696 A1 | 10/2019 | Campbell et al. | |
| 2019/0371367 A1 | 12/2019 | Asmussen et al. | |
| 2020/0006256 A1 | 1/2020 | Yazzie et al. | |
| 2021/0364485 A1 | 11/2021 | Fadrny et al. | |
| 2022/0026969 A1* | 1/2022 | Embleton | G06F 1/206 |

* cited by examiner

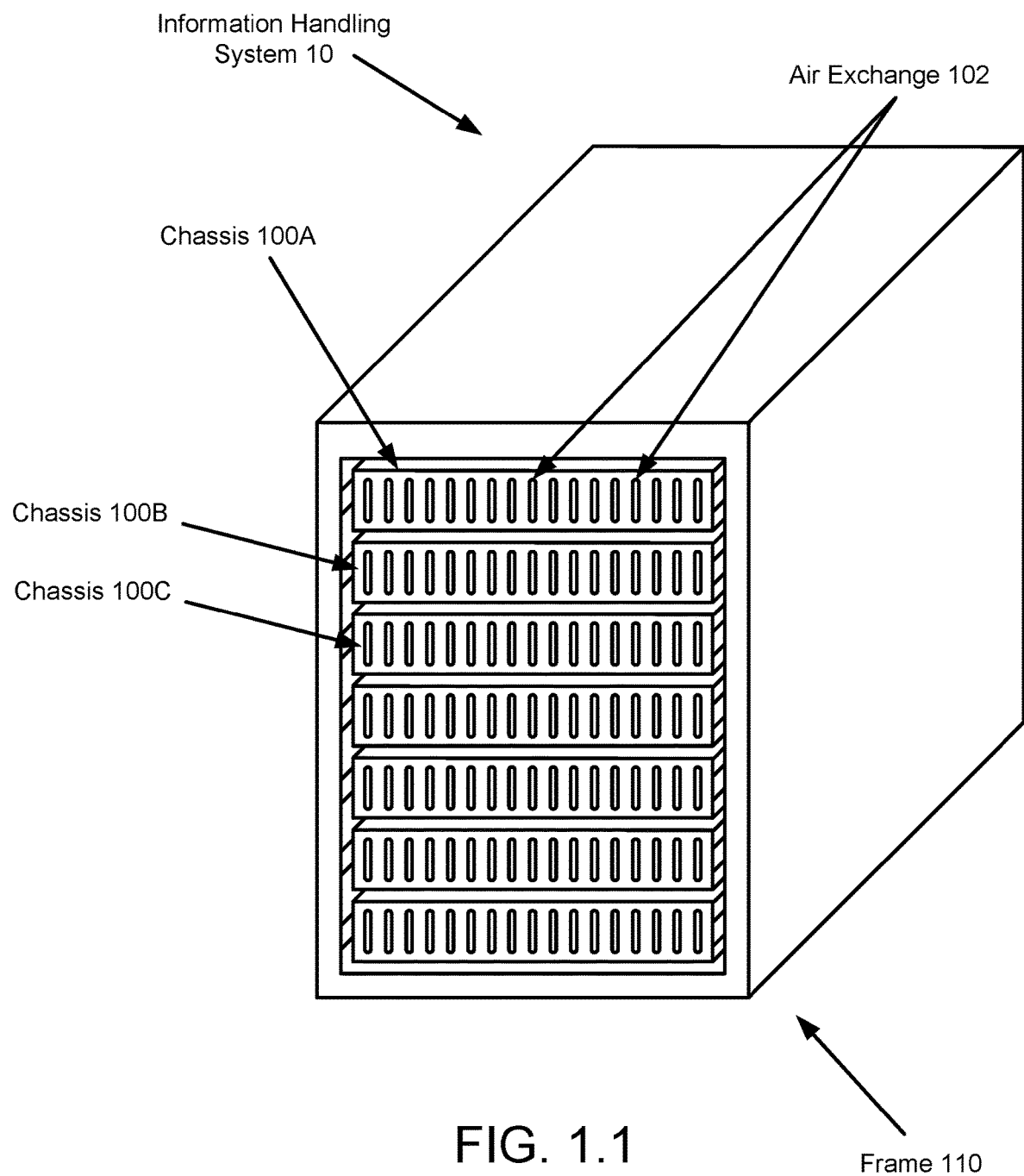
FIG. 1.1

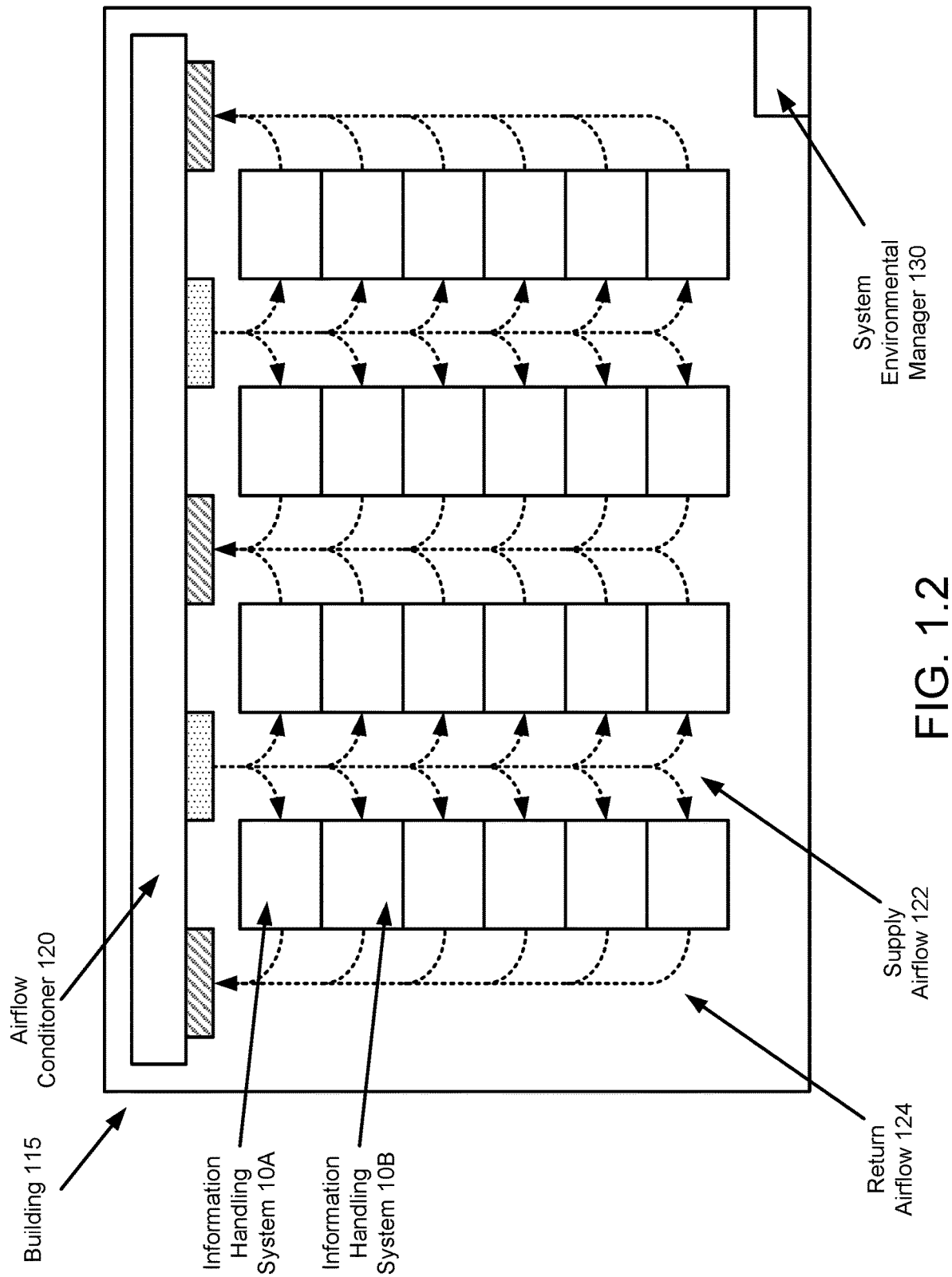
FIG. 1.2

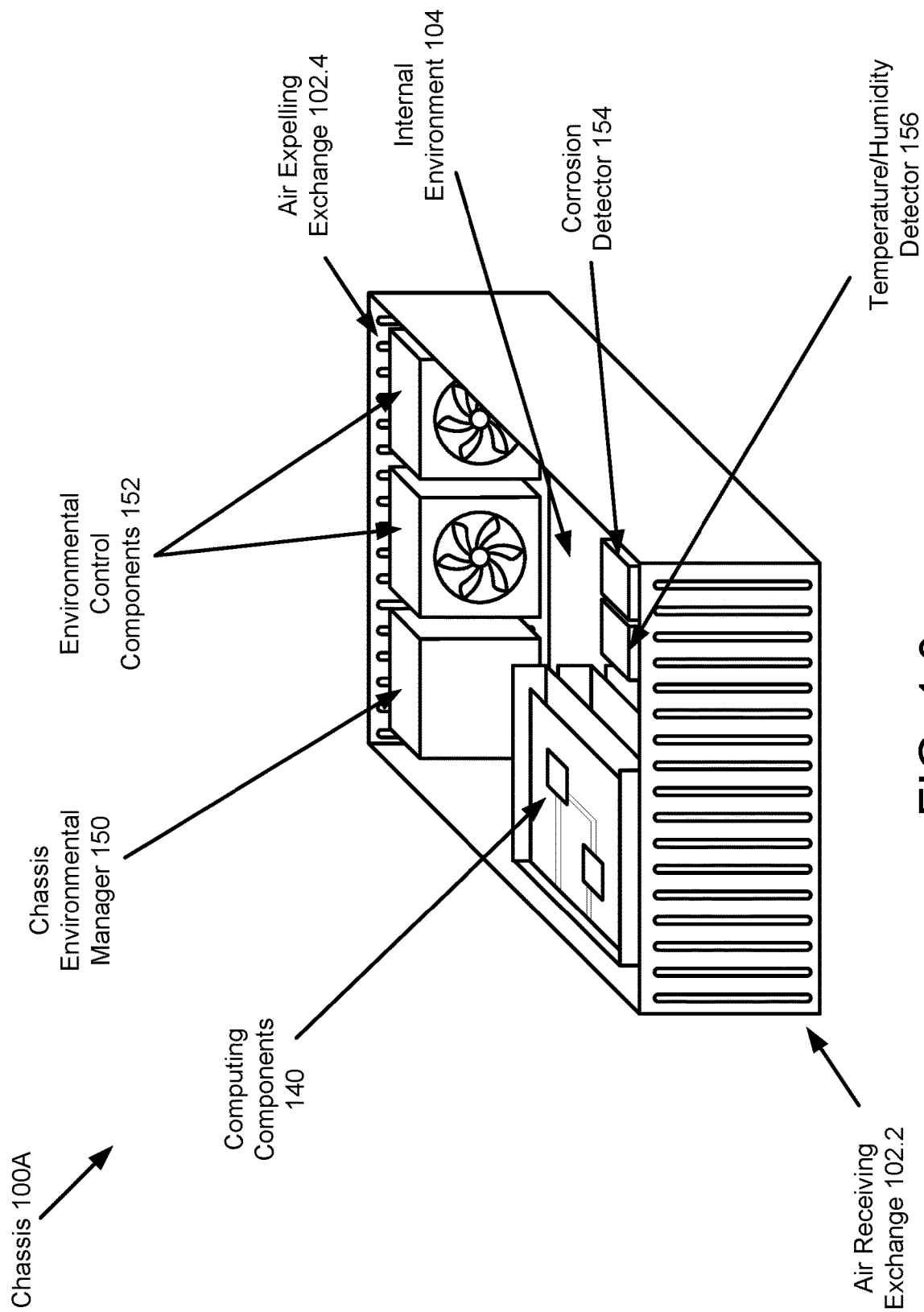
FIG. 1.3

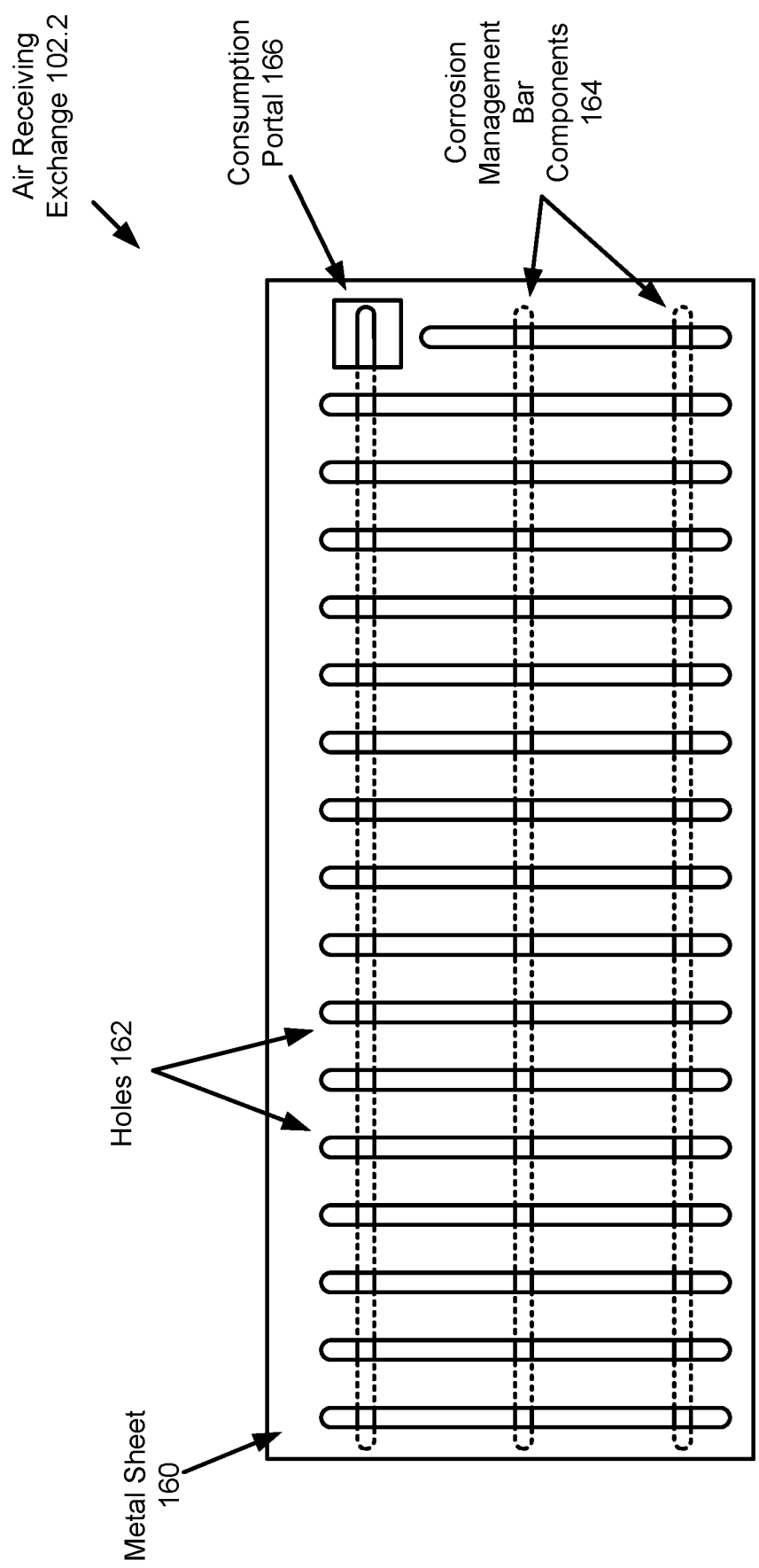
FIG. 1.4

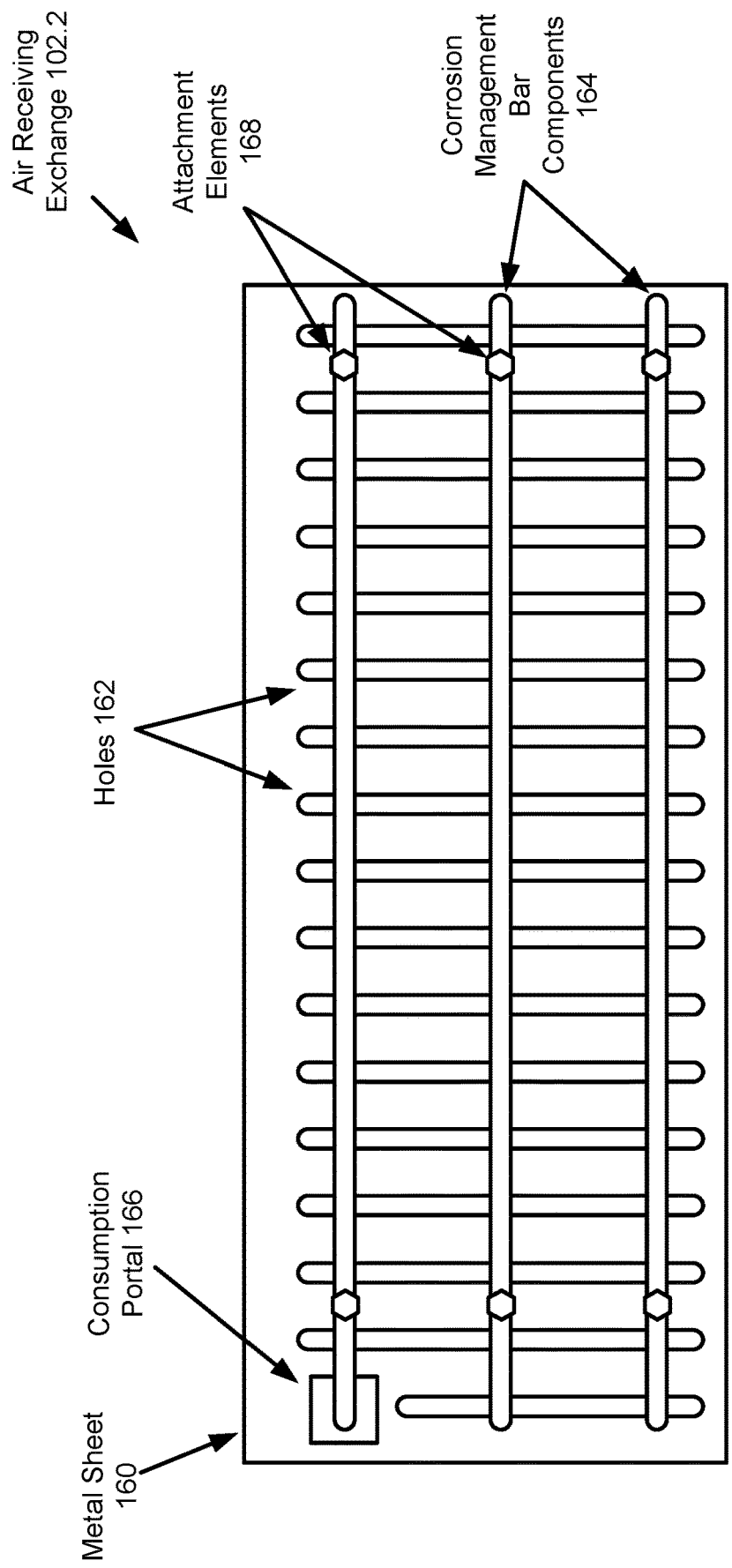
FIG. 1.5

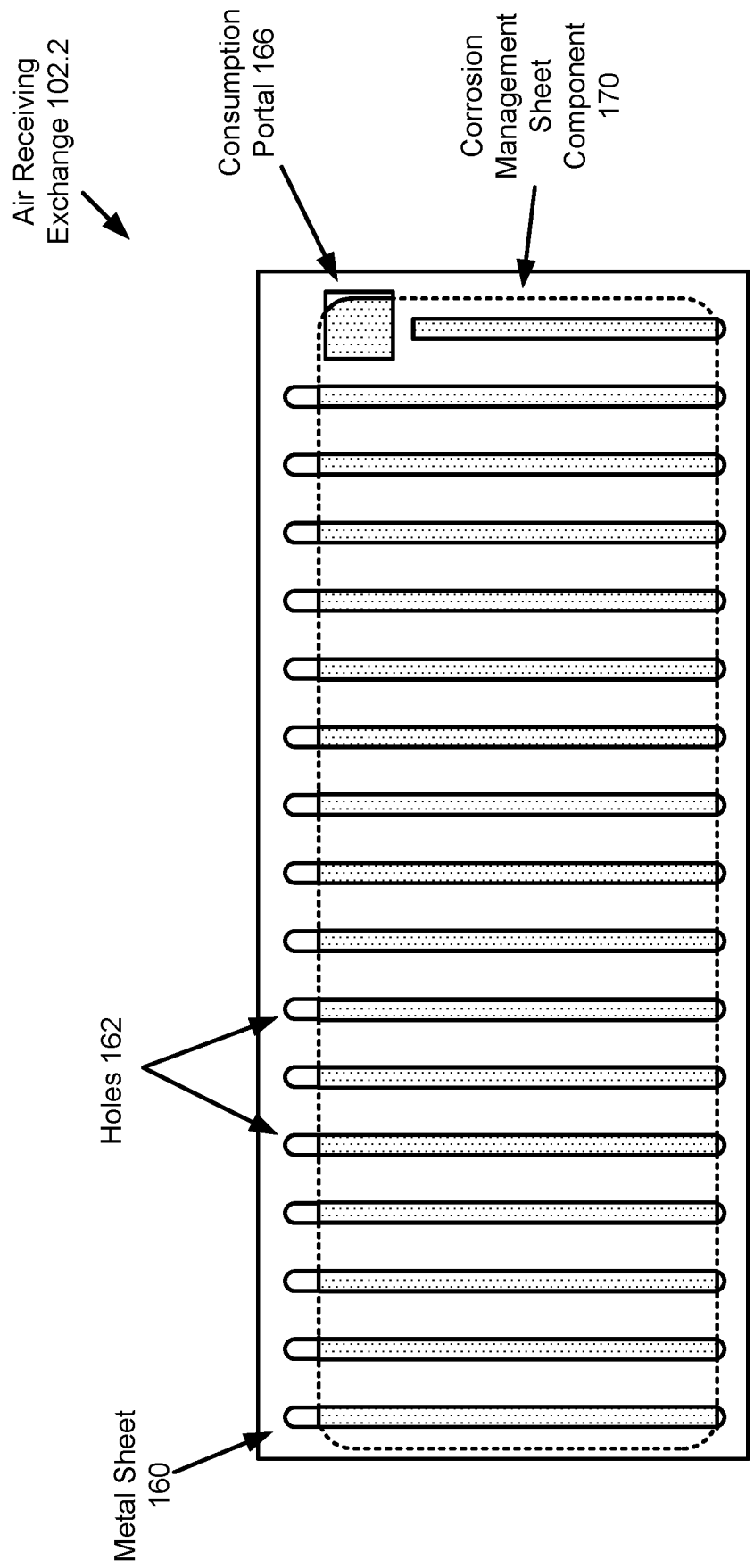
FIG. 1.6

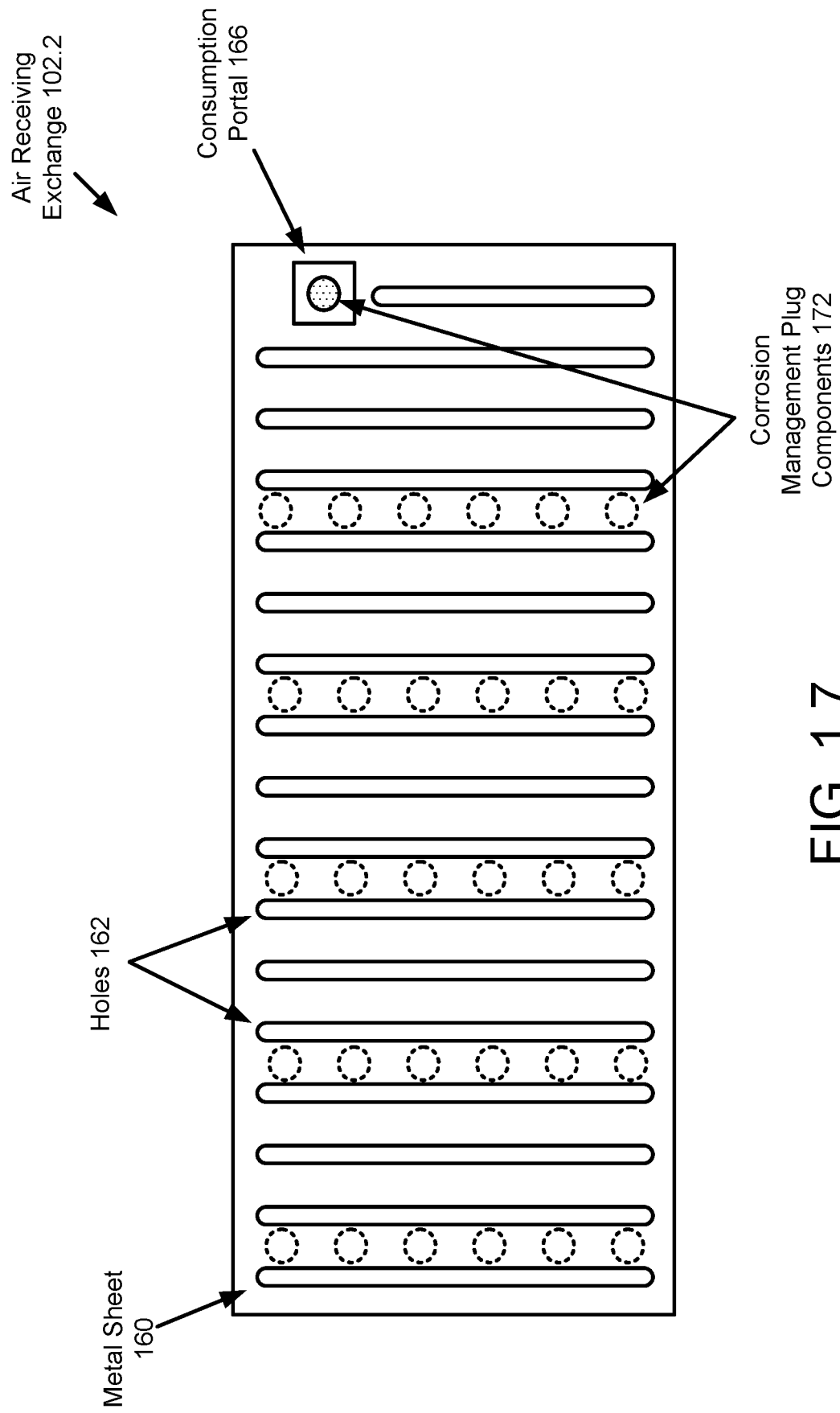
FIG. 1.7

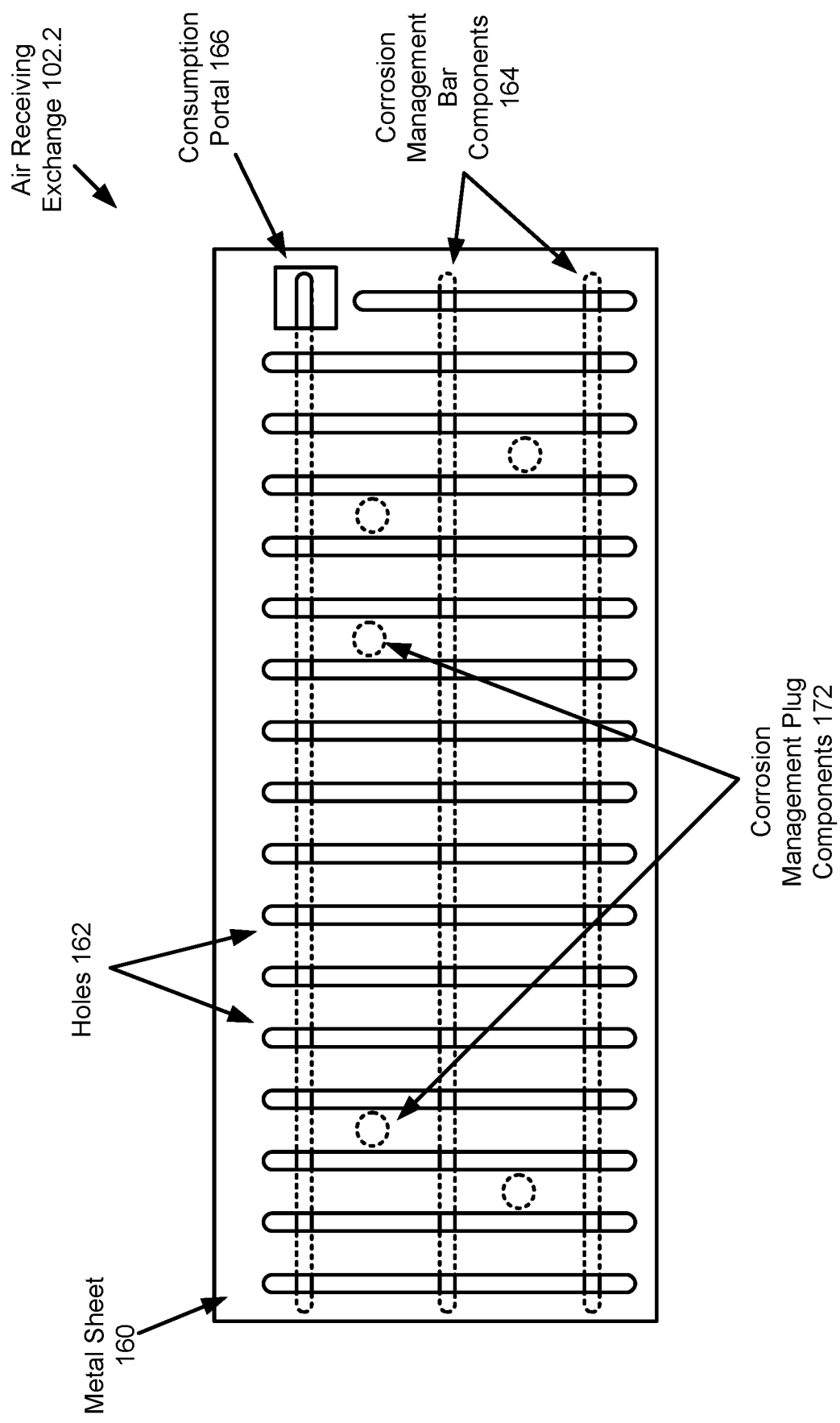
FIG. 1.8

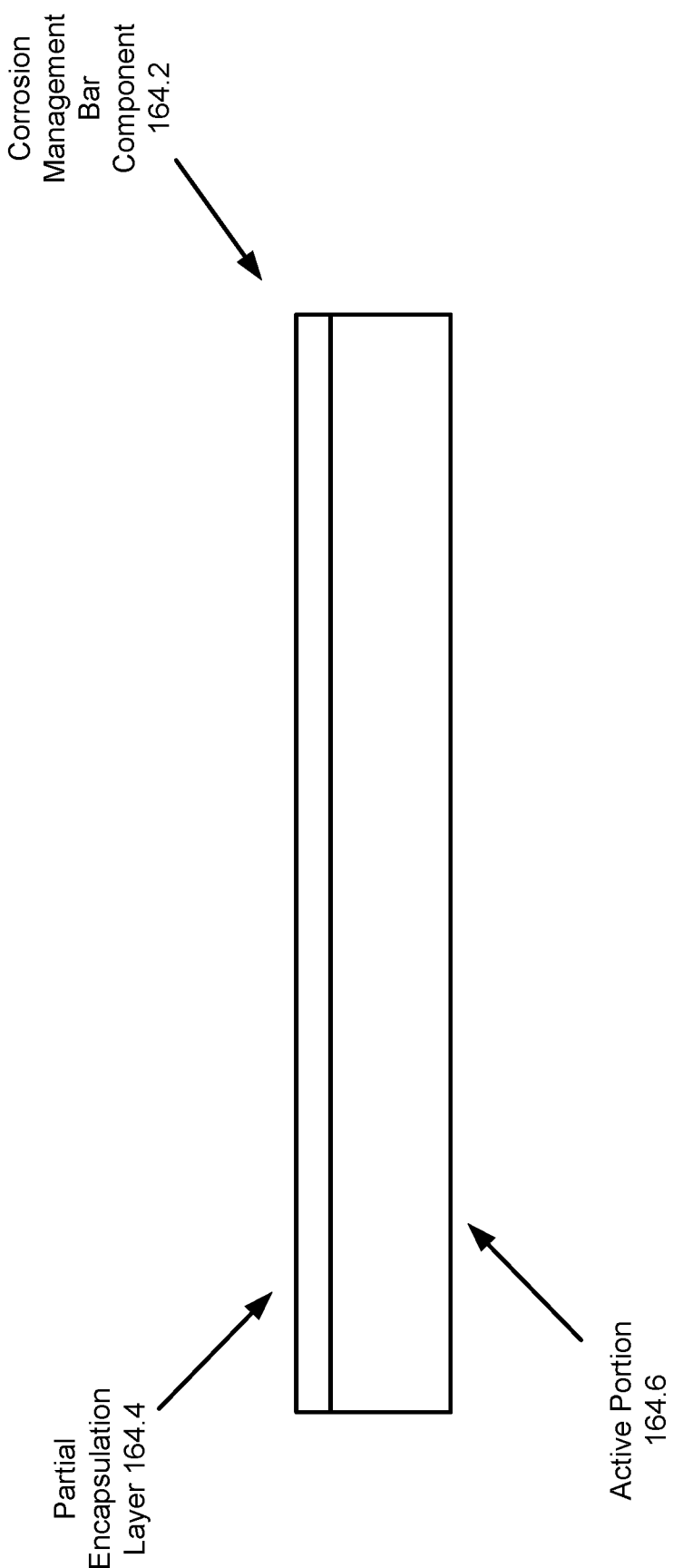
FIG. 1.9

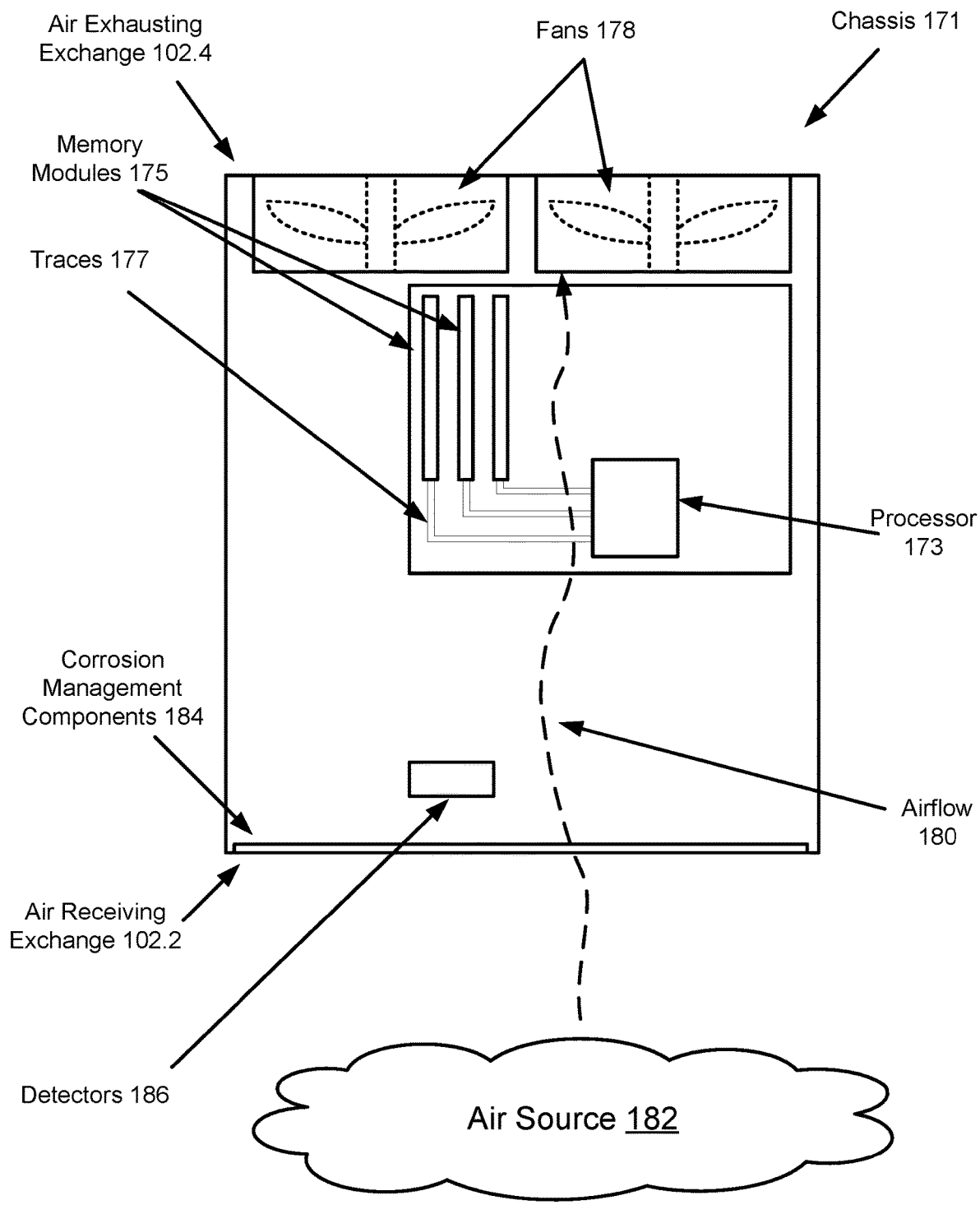
FIG. 1.10

_(54)_ SYSTEM AND METHOD FOR SERVICE LIFE MANAGEMENT BASED ON CHASSIS CORROSION RATE REDUCTION

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a computing device of an information handling system in accordance with one or more embodiments of the invention includes a computing component; and a chassis for housing the computing component. The chassis includes an air exchange for receiving gases for thermal management of the computing component and a corrosion management component, physically connected directly to the air exchange, that reduces a rate of corrosion of the air exchange due to the gases.

In one aspect, a method for environmentally managing a computing device of an information handling system in accordance with one or more embodiments of the invention includes monitoring an environmental corrosion risk associated with an air exchange of a chassis that houses a computing component of the computing device, a corrosion management component is: physically connected directly to the air exchange, and reduces a rate of corrosion of the air exchange due to gases used to manage a temperature of components of the computing device; making a determination that the air exchange is associated with the corrosion management component; in response to the determination: estimating a corrosion risk of the air exchange based on: the environmental corrosion risk, and a risk reduction factor associated with the corrosion management component; making a second determination that the corrosion risk of the air exchange indicates an unacceptable corrosion state; and remediating the corrosion risk of the air exchange based on the unacceptable corrosion state.

In one aspect, a non-transitory computer readable medium includes computer readable program code, which when executed by a computer processor enables the computer processor to perform a method for environmentally managing a computing device of an information handling system, the method includes monitoring an environmental corrosion risk associated with an air exchange of a chassis that houses a computing component of the computing device, a corrosion management component is: physically connected directly to the air exchange, and reduces a rate of corrosion of the air exchange due to gases used to manage a temperature of components of the computing device; making a determination that the air exchange is associated with the corrosion management component; in response to the determination: estimating a corrosion risk of the air exchange based on: the environmental corrosion risk, and a risk reduction factor associated with the corrosion management component; making a second determination that the corrosion risk of the air exchange indicates an unacceptable corrosion state; and remediating the corrosion risk of the air exchange based on the unacceptable corrosion state.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a building that includes information handling systems in accordance with one or more embodiments of the invention.

FIG. 1.3 shows a diagram of a chassis of an information handling systems in accordance with one or more embodiments of the invention.

FIG. 1.4 shows a front view diagram of an air exchange integrated with corrosion management bar components in accordance with one or more embodiments of the invention.

FIG. 1.5 shows a back view diagram of the air exchange integrated with corrosion management bar components in accordance with one or more embodiments of the invention.

FIG. 1.6 shows a front view diagram of an air exchange integrated with corrosion management sheet components in accordance with one or more embodiments of the invention.

FIG. 1.7 shows a front view diagram of an air exchange integrated with corrosion management plug components in accordance with one or more embodiments of the invention.

FIG. 1.8 shows a front view diagram of an air exchange integrated with an assortment of different types of corrosion management components in accordance with one or more embodiments of the invention.

FIG. 1.9 shows a side view diagram of a corrosion management bar component in accordance with one or more embodiments of the invention.

FIG. 1.10 shows a top view diagram of a chassis including an integrated air exchange in accordance with one or more embodiments of the invention.

DETAILED DESCRIPTION

Figure 2:
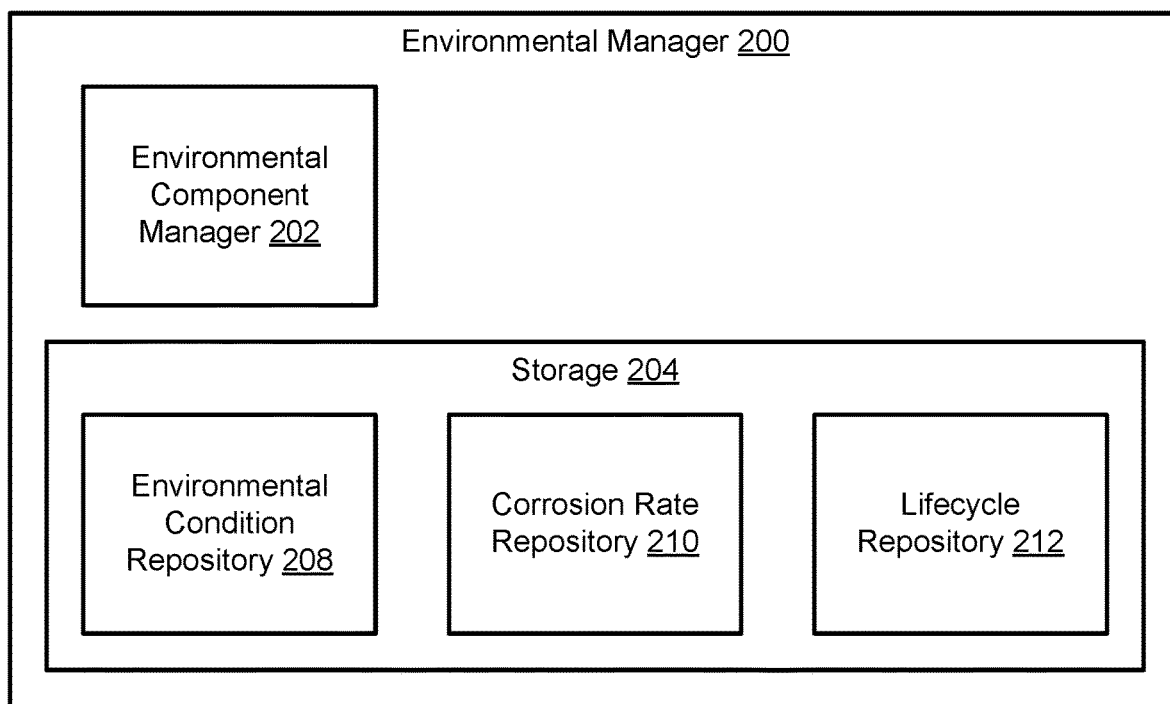
FIG. 2 shows a diagram of an environmental manager of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. The gases may be received through air exchanges of chassis in which the components are disposed. However, these gases may cause portions of the chassis to corrode. The corrosion of the chassis may potential cause damage to the components disposed within the chassis as well as change the visual appearance of the chassis (e.g., visual rust).

Embodiments of the invention may provide methods and systems that manage chassis corrosion. To manage the chassis corrosion, corrosion management components may be disposed on portions of the chassis that are likely to corrode, such as air exchanges. The corrosion managers may modify the reactivity of the portions of the chassis on which they are disposed. The modification in chemical reactivity may reduce the rate and/or likelihood of these portions of the chassis corroding.

By doing so, a system in accordance with embodiments of the invention may be less likely to prematurely fail or otherwise enter an undesirable corrosion state due to corrosion, be more likely to meet its service life goal, be able to accept a wider range of intake gas conditions that may be more likely to cause corrosion without negatively impacting the system, and/or may be less costly to operate by reducing the necessary level of conditioning of gases taken into the chassis of information handling systems for cooling purposes.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic. The gases may not be benign. For example, the gases may be (i) chemically reactive, (ii) include humidity, and/or (iii) otherwise interact with portions of the chassis and/or components disposed within the chassis in an undesirable manner. The reaction between the gases used to cool the components, portions of the chassis, and the components themselves (or other components proximate to the to-be-cooled components) may negatively impact the components disposed within the chassis and/or the chassis.

For example, if the gases include a chemically reactive component (e.g., chlorine species), the gases may react (i.e., chemically react) with portions of the chassis and/or components disposed within the chassis. These reactions may (i) generate corrosion on the portions of the chassis and/or (ii) generate corrosion on the components disposed within the chasses. This corrosion may (a) negatively impact the appearance of the chassis, (b) cause corrosion from the chassis to circulate within the chassis thereby potentially impacting the operation of components within the chassis, and/or (c) damage portions of the components disposed within the chassis directly resulting in a decreased service life of the components.

In another example, if the gases include humidity, the humidity may (under certain conditions) condense resulting in water (even at low levels) being disposed on the surfaces of the chassis and/or components. For example, when gases are taken into the chassis via an air exchange (102), water vapor may condense onto the surface of the air exchange.

When water is disposed on the surface of the chassis and/or components (even at very small levels), the water may chemically react forming corrosion. The aforementioned reactions with the condensed water may damage the chassis, generate corrosion products that may circulate throughout the chassis, and/or damage the components or otherwise cause them to operate in an undesirable manner.

The potential reactions, discussed above, may cause numerous negative impacts. First, the reactions may impact the appearance of the chassis. The reaction products may have an unsightly appearance that makes the chassis look impaired to a viewer. Second, the reaction products may not be fixedly attached thereby resulting in reaction products circulating throughout the interior of the chassis. These products may be deposited in unpredictable manners throughout the chassis. When deposited, the reaction products may cause, for example, short circuits, changes in impedance of circuits, or otherwise impact the ability of other components to perform their functionalities.

Third, the reactions may impact the physical size of various components disposed within the chassis. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to meeting its service life. A service life may be a desired duration of operation of a component, device, or system.

To address the above and/or other potential issues, embodiments of the invention may provide methods, devices, and systems that mitigate corrosion. To mitigate corrosion, corrosion management components may be utilized. A corrosion management component may be a component that limits the occurrence of corrosion of one or more managed components for which the corrosion management component provides corrosion management services.

To provide corrosion management services, the corrosion management components may modify the reactivity of components for which they provide corrosion management services. For example, the corrosion management components may modify the corrosion susceptibility of an air exchange (102) through which gases, used for thermal management purposes, are received. A corresponding air exchange (102) may be used to exhaust gases after cool gases have been used to cool components within the chassis (100A).

To modify the corrosion susceptibility of other components such as the air exchange (102), the corrosion management components may generate a voltage potential between the managed component and the corrosion management component. The voltage potential may reduce the likelihood that the managed component will react with gases or condensed liquids. For example, the voltage potential may create and/or remove free charge in the managed component that reduces the likelihood of chemical reactions from occurring.

In one or more embodiments of the invention, the corrosion management components are implemented as sacrificial anodes. A sacrificial anode may be a portion of material that, when placed in contact with another material, forms a potential cell between the two components. The potential cell may preferentially charge a managed component in a manner that makes it less chemically reactive and may preferentially charge the corrosion management component in a manner that makes it more chemically reactive.

For example, if a to-be-managed component is formed of copper metal, a corrosion management component may be a portion of zinc. When placed in direct contact with the copper metal, a potential cell may be formed thereby causing the copper metal to be less susceptible to corrosion while the zinc material becomes more likely to corrode. Consequently, when the corrosion management component is placed in contact with the managed component, the corrosion susceptibility of the managed component may be greatly reduced at the cost of the zinc material corroding at an accelerated rate (when compared to the rate of corrosion when the zinc material is not in contact with the copper material).

In another example, if a to-be-manage component forms a portion of a chassis, it may include metal sheets with holes to form an air exchange. The holes may be circumscribed by cut edges by virtue of the method of manufacturing the holes. These cut edges may be particularly susceptible to corrosion due to the surface morphology of the cut edge (e.g., high surface areas) and the large per unit time rate of gases flowing proximate to the cut edges. To reduce the likelihood of corrosion being formed, corrosion management components may be attached directly to the metal sheets. The corrosion management components may reduce the chemical reactivity of the metal sheets including the cut edges thereby reducing the corrosion risk in these high corrosion risk areas. The corrosion management components may be selectively deployed at locations that have, for example, lower rates of gas flow. Consequently, even if corrosion is formed on the corrosion management components, it may be less likely to circulate within the chassis by virtue of the gas flow.

For additional details regarding corrosion management components, refer to FIGS. 1.4-1.10.

In addition to managing corrosion using corrosion management components, a system in accordance with embodiments of the invention may manage the environments themselves based on the risk of corrosion occurring. For example, a system may monitor the environmental conditions and/or rates of corrosion that are occurring to determine if a risk of corrosion exists. If the risk of corrosion is sufficiently high, even when corrosion management components are utilized, the system may automatically take steps to reduce the risk of corrosion. For example, the system may automatically schedule replacement of the corrosion management components if the corrosion management components lack sufficient remaining capacity to manage corrosion.

Figure 3:
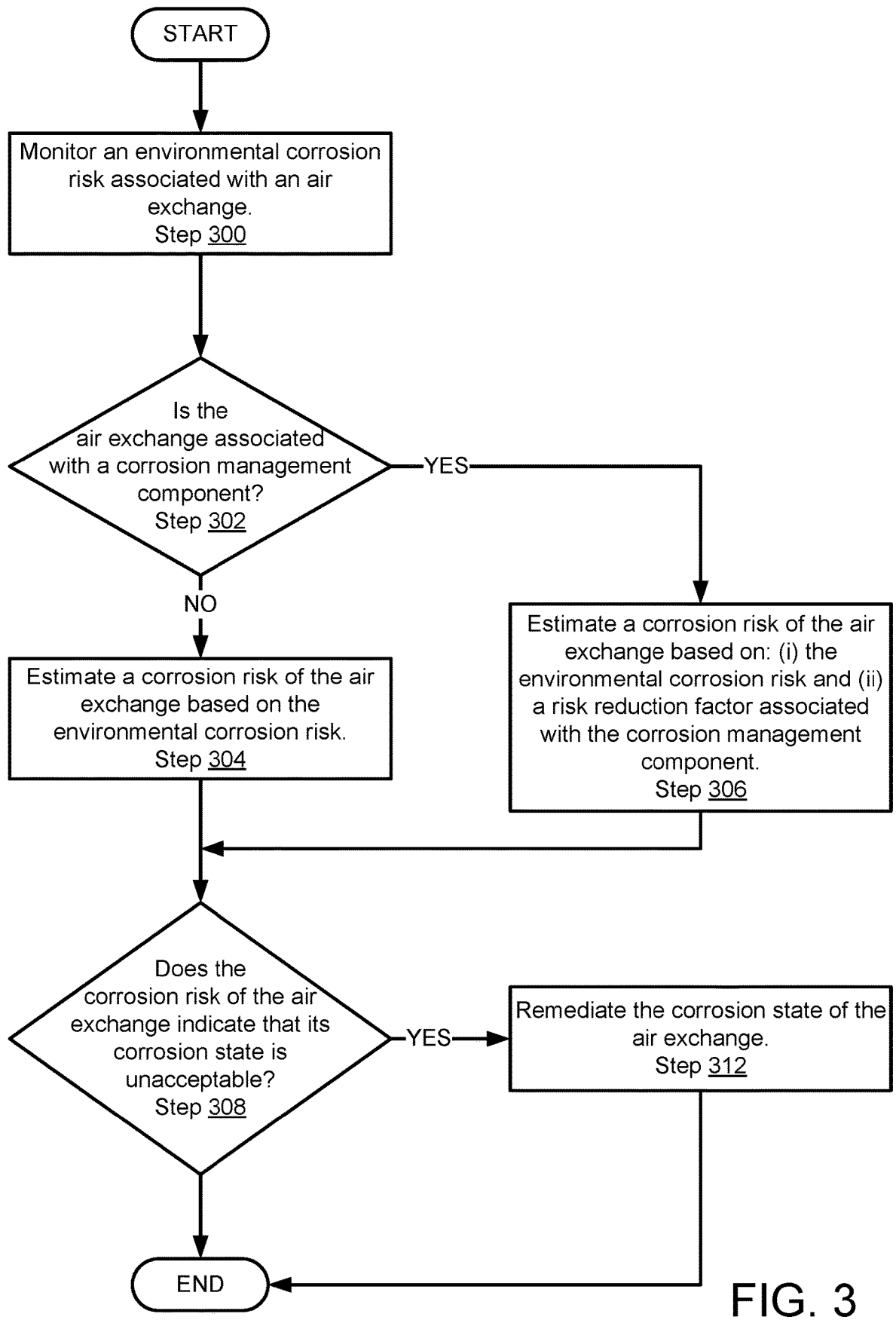
FIG. 3 shows a flowchart of a method of managing corrosion states in accordance with one or more embodiments of the invention.

For additional details regarding environment management, refer to FIGS. 2-3.

To further clarify the environments in which corrosion may arise, a diagram of an environment in which a chassis may reside is illustrated in FIG. 1.2 and a diagram of a chassis is provided in FIG. 1.3.

Turning to FIG. 1.2, FIG. 1.2 shows a top view diagram of a building (115) in which chassis may reside in accordance with one or more embodiments of the invention. The building (115) may house a data center (e.g., an aggregation of information handling systems) that includes any number of information handling systems (e.g., 10A, 10B). The information handling systems may include chassis which may need to intake and exhaust gases for temperature regulation purposes.

To facilitate gas management within the building (115), the information handling systems may be organized into rows (or other groupings of information handling systems). In FIG. 1.2, the rows of information handling system extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled, and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.).

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

The system environmental manager (130) may be implemented using a computing device. For additional details regarding computing devices, refer to FIG. 4. The system environmental manager (130) may perform all, or a portion, of the method illustrated in FIG. 3 while providing its functionality.

Turning to FIG. 1.3, FIG. 1.3 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services). To provide services, the computing device may utilize computing resources provided by computing components (140). The computing components (140) may include, for example, processors, memory modules, storage devices, special purpose hardware, and/or other types of physical components that contribute to the operation of the computing device. For additional details regarding computing devices, refer to FIG. 4.

Because the computing device uses computing components (140) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis.

To maintain the temperatures of the computing components (140) (and/or other types of components) within a nominal range, gases may be taken in through an air receiving exchange (102.2). The gases may be passed by the computing components (140) to exchange heat with them. The heated gases may then be expelled out of an air expelling exchange (102.4).

However, by taking in and expelling gases used for cooling purposes, the air receiving exchange (102.2), other portions of the chassis (100A) and/or components disposed within the chassis (100A) may be subject to degradation due to corrosion. For example, as discussed above, the gases may include components such as humidity or chemical species that may chemically react forming corrosion. The chemical reaction products (e.g., corrosion) may form corrosion, cause corrosion products to circulate in the chassis (and/or outside of the chassis by being expelled as part of heated gases), and/or damage the structure and/or change the electrical properties of the computing components (140). These changes may negatively impact the ability of the computing device to provide its functionality.

For example, the computing device may have a service life during which it is expected that the computing device will be likely to provide its functionality. However, changes in the structure and/or electrical properties of these components due to exposure to humidity or other components of the gases used for temperature regulation purposes may cause the components to prematurely fail ahead of the service life of the computing device due to corrosion formation, change an appearance of the chassis by virtue of the presence of corrosion products, and/or otherwise negatively impact the chassis (100A).

In general, embodiments of the invention provide methods, devices, and systems for managing corrosion within chassis. To manage corrosion, a system in accordance with embodiments of the invention may (i) reduce the likelihood of corrosion occurring, (ii) monitoring the occurrence of corrosion, and (iii) based on the monitoring, modify the internal environment of a chassis and/or the chassis itself to reduce the prevalence of corrosion and/or reduce the amount of power used for environmental management purposes.

By doing so, embodiments of the invention may reduce the corrosion on the chassis and/or components while limiting power consumption. By doing so, the computing devices disposed within the chassis (100A) may be more likely to meet their respective service life goals, have lower operation costs, and/or require fewer repairs during their respective service life.

To manage the internal environment (104) of the chassis, the chassis (100A) may include a chassis environmental manager (150). The chassis environmental manager (150) may provide environmental management services. Environmental management services may include (i) obtaining information regarding the rates of corrosion of the chassis and/or component within, (ii) determining, based on the corrosion rates, whether the service life goals are likely to be impacted by the corrosion, and (iii) modifying the operation (e.g., modifying operating points) of environmental control components (152) and/or the chassis (100A) to reduce corrosion and/or reduce the amount of power consumed for environmental management purposes. For additional details regarding the chassis environmental manager (150), refer to FIG. 2.

While illustrated in FIG. 1.3 as a physical structure, as will be discussed with respect to FIG. 2, the chassis environmental manager (150) may be implemented as a logical entity (e.g., a program executing using the computing components (140)). For example, a computing device disposed in the chassis may host a program that provides the functionality of the chassis environmental manager (150).

To enable the chassis environmental manager (150) to provide its functionality, the chassis (100A) may include one or more detectors (e.g., 154, 156). These detectors may enable the rates of corrosion of various components (e.g., portions of the chassis, computing components, etc.) to be determined and/or environmental conditions within and/or proximate to the chassis to be determined. These detectors may be implemented as sensors or other types of physical devices that are operably connected to the chassis environmental manager (150). Any number of corrosion detectors (e.g., 154), temperature detectors (e.g., 156), humidity detectors (e.g., 156), and/or other types of detectors may be disposed at any number of locations throughout the chassis (100A).

In some embodiments of the invention, the functionality of a temperature detector may be provided by, in all or in part, the computing components (140). For example, the computing components (140) may include functionality to report their respective temperatures and/or temperatures of the internal environment (104) of the chassis (100A).

The chassis (100A) may also include environmental control components (152). The environmental control components (152) may include physical devices that include functionality to modify characteristics (e.g., temperature, humidity level, airflow rates/directions) of the internal environment (104) of the chassis (100A). The chassis (100A) may include any number of environmental control components disposed at any number of locations within the chassis.

For example, the environmental control components (152) may include gas movers such as fans. The fans may be able to modify the rate of gases being taken into and expelled from the chassis (100A) through the air exchangers (e.g., 102.2, 102.4). The rate of intake and exhaust of gases may cause an airflow to be generated within the internal environment (104). The airflow may be used to modify the rate of thermal exchange between the computing components (140) and the internal environment (104) (e.g., an environment proximate to the computing components (140)).

In another example, the environmental control components (152) may include heaters. The heaters may be able to modify the temperature of the internal environment (104). For example, heaters may be disposed at a front of the chassis (e.g., where gases are taken into the chassis) and/or about different locations within the chassis. These heaters may be used to generally and/or locally heat the internal environment (104). By doing so, the relative humidity level and temperature of the internal environment (104) proximate to the computing components (140) and/or different components may be controlled. The temperature and/or relative humidity level may be utilized to limit, reduce, or otherwise control corrosion rates of the computing components (140).

In a still further example, the environmental control components (152) may include components that are not disposed in the chassis (not shown). For example, the environmental control components may include an airflow conditioner discussed with respect to FIG. 1.2. These external components may be used in conjunction with the environment control components disposed within the chassis to manage the temperature and/or relative humidity levels throughout the internal environment (104) of the chassis as well as those of gases as they are taken into and/or expelled by the chassis (100A).

The chassis (100A) may include any number and type of environmental control components without departing from the invention. Any of the environmental control components may be implemented using physical devices operably connected to and/or controllable by the chassis environmental manager (150) and/or a system environmental manager (e.g., 130, FIG. 1.2) (alone or in combination). Any number of chassis environmental managers and system environmental managers may cooperatively operate to control the temperature and/or relative humidity levels to control the rate of corrosion occurring within the chassis and/or manage the thermal load generated by the computing components (140) and/or other components.

To cooperatively operate, the chassis environmental managers and system environmental managers may be operably connected to each another (e.g., via wired and/or wireless networks). The aforementioned components may share information with one another (e.g., detector data, operating set points of different environmental control components, etc.). These components may implement any type of model for controlling and/or delegating control of the system for temperature, relative humidity level, and/or corrosion rate management purposes. When providing their respective functionalities, these components may perform all, or a portion, of the method illustrated in FIG. 3. Any of these components may be implemented using a computing device. For additional details regarding computing devices, refer to FIG. 4.

While the chassis (100A) of FIG. 1.3 has been illustrated as including a limited number of specific components, a chassis in accordance with one or more embodiments of the invention may include additional, fewer, and/or different components without departing from the invention. Additionally, while the chassis (100A) is illustrated as having a specific form factor (e.g., rack mount), a chassis in accordance with embodiments of the invention may have different form factors without departing from the invention.

As discussed above, the chassis (100A) may include corrosion management components. The corrosion management components may be used to control corrosion of the air receiving exchange (102.2) and/or other portions of the chassis. To further clarify corrosion management components, FIGS. 1.4-1.9 show diagrams of corrosion management components and air exchanges in accordance with one or more embodiments of the invention.

Turning to FIG. 1.4, FIG. 1.4 shows a front view diagram of the air receiving exchange (102.2) computing components (140) in accordance with one or more embodiments of the invention. As noted above, gases used for thermal management purposes may be taken in through the air receiving exchange (102.2).

The air receiving exchange (102.2) may include a metal sheet (160). Any number of holes (162) of any shape and size may penetrate through the metal sheet to enable gases to flow through the metal sheet (160).

The holes in the metal sheet may be formed using mechanical manufacturing processes such as punching, machining, etc. These processes may result in cut edges of the metal sheet (160) circumscribing the holes (162). These cut edges may be particularly susceptible to corrosion.

For example, the cut edges may have a morphology that makes them more susceptible to corrosion. The cut edges may have a larger amount of surface roughness than other portions of the metal sheet. The surface roughness may increase the contact area between the metal sheet and condensed humidity in these regions and/or reactive chemical species included in gases that pass through the holes. Consequently, these portions of the metal sheet may be more likely to chemically react.

In another example, the cut edges of the metal sheet may be exposed to larger volumes of gases by virtue of their respective locations. As gases flow though the holes, the cut edges may be exposed to a higher per unit time quantity of gases than other areas of the metal sheets. Consequently, these portions of the metal sheet may be more likely to corrode at higher rates by virtue of their exposure to large volumes of gases.

If corrosion does occur, the corrosion may have several negative impacts. First, the corrosion may be highly visible. Corrosion products may have a starkly different appearance than the metal sheet (160). Further, by virtue of the location of the air receiving exchange (102.2), it may be highly visible to a person. Corrosion products may include, for example, metals that have reacted to form oxides (e.g., copper oxide), salts (e.g., copper chloride), or other materials that have dissimilar properties and appearances when compared to metals.

Second, corrosion of the metal sheet (160) may cause corrosion products to circulate within a chassis. By virtue of the function of the air receiving exchange (102.2), it is likely to be exposed to significant flows of gases. Further, corrosion products may not be fixedly attached to the metal sheet (160) (unlike various portions of the metal sheet itself). Consequently, corrosion products may be picked up by gases taken into the chassis through the holes (162) in the air receiving exchange (102.2). Once taken into the chassis, these corrosion products may negatively impact any number of components disposed within the chassis.

To manage corrosion of the air receiving exchange (102.2), the air receiving exchange (102.2) may include corrosion management bar components (164). The corrosion management bar components (164) may provide corrosion management services. Specifically, the corrosion management bar components (164) may reduce the rate of corrosion of the metal sheet (160) when compared to its rate of corrosion when not receiving corrosion management services.

To do so, when placed in contact with the metal sheet (160), the corrosion management bar components (164) may reduce the rate of corrosion of the metal sheet (160) while increasing its own rate of corrosion. For example, the corrosion management bar components (164) may be implemented as bars of zinc metal attached to an interior surface of the air receiving exchange (102.2). Thus, only portions of the corrosion management bar components (164) that are visible through the holes (162) may be seen from a person outside of the chassis (i.e., the view point of FIG. 1.4). In FIG. 1.4, the portions of the corrosion management bar components (164) obscured from view by the metal sheet (160) are illustrated in dashing.

In one or more embodiments of the invention, the corrosion management bar components (164) have a finite capacity for providing corrosion management services. To provide corrosion management services, the corrosion management bar components (164) may corrode. If the level of corrosion of the corrosion management bar components (164) exceeds a predetermined amount, the corrosion management bar components (164) may no longer be able to provide corrosion management services to the air receiving exchange (102.2). In other words, the corrosion management bar components (164) may fail if the corrosion management bar components (164) corrode a predetermined amount. The predetermined amount may be adjusted based on the size, shape, and/or other characteristics of the corrosion management bar components (164).

For example, larger bars of zinc metal may be able to provide corrosion management services for longer durations of time by virtue of the large amount of zinc which may take longer to corrode.

In one or more embodiments of the invention, the corrosion management bar components (164) provide a visual indication of their corrosion level. For example, the color of the corrosion management bar components (164) may change to reflect the amount of corrosion of the corrosion management bar components (164) that has occurred.

To enable an administrator of chassis to ascertain the level of corrosion of the corrosion management bar components (164), the air receiving exchange (102.2) may include a consumption portal (166). A consumption portal (166) may include a hole through the metal sheet which enables a person outside of a chassis to view a portion of the corrosion management bar components (164). By doing so, an administrator may be apprised of whether the corrosion management bar components (164) are still able to provide corrosion management services based on a visual inspection.

In one or more embodiments of the invention, the corrosion management bar components (164) are detachable from the metal sheet (160). Consequently, if the corrosion management bar components (164) have exceeded a desired level of corrosion, the corrosion management bar components (164) may be replaced.

In one or more embodiments of the invention, the corrosion management bar components (164) are implemented as rectangular bars of metal. The metal bars may be reversibly attached to the metal sheet (160). The metal bars may be attached in an orientation that extends them over multiple holes (162), as seen in FIG. 1.4. By attaching them as illustrated in FIG. 1.4, the corrosion management services provided by the corrosion management bar components (164) may be distributed across the air receiving exchange (102.2).

For example, by virtue of the manner in which the corrosion management bar components (164) provide corrosion management services (e.g., via a potential cell), the extent of corrosion management services may be limited in extent. Consequently, the quality of corrosion management services provided by the corrosion management bar components (164) may decrease as a function of a distance away from the location where the potential cell is formed.

To further clarify aspects of the air receiving exchange (102.2), FIG. 1.5 shows a back view diagram of the air receiving exchange (102.2). As seen in FIG. 1.5, the corrosion management bar components (164) may be attached to the metal sheet using attachment elements (168).

While in FIG. 1.5 the attachment elements (168) are illustrated as bolts, the attachment elements (168) may be other types of structures without departing from the invention. For example, the attachment elements (168) may be implemented using screws, rivets, clips, or any other means for retaining the position and/or orientation of the corrosion management bar components.

While the air receiving exchange (102.2) has been illustrated as including a specific number of corrosion management bar components, an air receiving exchange may include different number of corrosion management components, the corrosion management may have different shapes, the corrosion management components may be placed in different locations, and/or the air receiving exchange may include different, fewer, and/or additional components from those illustrated in FIG. 1.5 without departing from the invention.

To further clarify aspect of corrosion management components, FIGS. 1.6-1.8 shows diagrams of the air receiving exchange (102.2) integrated with different types of corrosion management components. Additionally, FIG. 1.9 shows a diagram of a corrosion management component in accordance with embodiments of the invention. Lastly, FIG. 1.10 shows a diagram of an air management component integrated into a chassis in accordance with one or more embodiments of the invention.

Turning to FIG. 1.6, FIG. 1.6 shows a front view diagram of the air receiving exchange (102.2) integrated with a corrosion management sheet component (170) in accordance with one or more embodiments of the invention.

The corrosion management sheet component (170) may perform similar functionality to that described with respect to the corrosion management bar components (164, FIG. 1.5). In contrast to the similar function, the corrosion management sheet component (170) may have a substantially different form from the corrosion management bar components (164, FIG. 1.5).

In FIG. 1.6, portions of the corrosion management sheet component (170) that are obscured from the viewpoint in FIG. 1.6 are illustrated using dashed lines. Portions of the corrosion management sheet component (170) that are visible are illustrated using dotted infill.

In one or more embodiments of the invention, the corrosion management sheet component (170) is a rectangular shape as illustrated in FIG. 1.6. The rectangular sheet may extend across all, or portion, of the holes (162). At least a portion of the corrosion management sheet component (170) may extend to the consumption portal (166) to enable a person to view the portion of the corrosion management sheet component (170) for visual inspection purposes and corrosion management.

In one or more embodiments of the invention, the corrosion management sheet component (170) includes a plurality of holes. For example, the corrosion management sheet component (170) may be implemented as a flat sheet of metal with a plurality of holes (not shown in FIG. 1.6). The holes in the corrosion management sheet component (170) may enable gases to flow through the corrosion management sheet component (170).

For example, the corrosion management sheet component (170) may be implemented using metal foam. The metal foam may be an open cell metal foam that enables gases to pass through the metal foam.

While not illustrated in FIG. 1.6, the corrosion management sheet component (170) may be attached to the metal sheet (160) using any number and type of attachment element. Using the attachment elements, the corrosion management sheet component (170) may be pressed against the metal sheet (160) thereby forming a potential cell that modifies the rate of corrosion of the metal sheet (160).

While the corrosion management sheet component (170) is illustrated in FIG. 1.6 as being one continuous structure, the corrosion management sheet component (170) may be divided into any number of portions, each of the portions may have similar and/or different thicknesses from each other, and/or the air receiving exchange may include different, fewer, and/or additional components from those illustrated in FIG. 1.6 without departing from the invention.

Turning to FIG. 1.7, FIG. 1.7 shows a front view diagram of the air receiving exchange (102.2) integrated with corrosion management plug components (172) in accordance with one or more embodiments of the invention.

The corrosion management plug components (172) may perform similar functionality to that described with respect to the corrosion management bar components (164, FIG. 1.5). In contrast to the similar function, the corrosion management plug components (172) may have a substantially different form from the corrosion management bar components (164, FIG. 1.5).

In FIG. 1.7, portions of the corrosion management plug components (172) that are obscured from the viewpoint in FIG. 1.7 are illustrated using dashed lines.

In one or more embodiments of the invention, the corrosion management plug components (172) are discrete elements. For example, each of the plug components may be formed as a cylindrical structure as illustrated in FIG. 1.7. The cylindrical structures may be of a size that enables them to be disposed at locations on the metal sheet (160) that do not coincide with the holes (162) in the metal sheet (160). By doing so, the corrosion management plug components (172) may generally be outside of the path of gas flow through the metal sheet (160).

At least one of the corrosion management plug components (172) may extend to the consumption portal (166) to enable a person ascertain the level of corrosion of the corrosion management plug components (172). It may be assumed that the other corrosion management plug components (172) that are not visible have a similar level of corrosion.

In one or more embodiments of the invention, the corrosion management plug components (172) include at least one mounting element such as a center hole. The mounting element, in combination with an attachment element, may enable the corrosion management plug components (172) to be attached to the metal sheet (160).

While not illustrated in FIG. 1.7, the corrosion management plug components (172) may be attached to the metal sheet (160) using any number and types of attachment elements. Using the attachment elements, the corrosion management plug components (172) may be pressed against the metal sheet (160) thereby forming a potential cell that modifies the rate of corrosion of the metal sheet (160).

While the corrosion management plug components (172) are illustrated in FIG. 1.7 as being discrete structures of similar shape and size, the corrosion management plug components (172) may have different shapes (e.g., some square, some rectangular, some circular, etc.), each of the portions may have similar and/or different thicknesses from each other, and/or the air receiving exchange may include different, fewer, and/or additional components from those illustrated in FIG. 1.7 without departing from the invention.

Turning to FIG. 1.8, FIG. 1.8 shows a front view diagram of the air receiving exchange (102.2) integrated with multiple types of corrosion management components in accordance with one or more embodiments of the invention.

As seen in FIG. 1.8, a combination of corrosion management bar components (164) and corrosion management plug components (172) have been integrated into the air receiving exchange (102.2). Additionally, these components have not been uniformly distributed across the metal sheet (160). By doing so, different portions of the metal sheet (160) may be at different degrees of susceptibility to corrosion. In other words, the metal sheet (160) may be imparted with an adjustable inhomogeneous corrosion resistance.

The inhomogeneous corrosion resistance of the metal sheet (160) may be tailored based on the placement of the corrosion management plug components (172) and the corrosion management bar components (164). The inhomogeneous corrosion resistance of the metal sheet (160) may be tailored based on the susceptibility of downstream components to corrosion and/or corrosion from the metal sheet (160) being carried downstream.

For example, some computing components may be far more susceptible to the downstream impact of corrosion (e.g., open circuitry) while others may be less susceptible (e.g., hermetically sealed circuitry such as packaged chips). For areas downstream of the air receiving exchange (102.2) that are more susceptible to the downstream impact of corrosion, additional corrosion management components may be integrated upstream. In contrast, for downstream areas of the air receiving exchange (102.2) that are less susceptible to the downstream impacts of corrosion, pure corrosion management components to be integrated upstream. By doing so, the corrosion susceptibility of the metal sheet (160) may be tailored to that of the components downstream from the air receiving exchange (102.2).

Turning to FIG. 1.9, FIG. 1.9 shows a side view diagram of the corrosion management bar component (164.2) in accordance with one or more embodiments of the invention. In FIG. 1.9, the upper portion of the corrosion management bar component (164.2) may be pressed against the metal sheet or other type of component to form potential cell.

As discussed above, as the corrosion management bar component (164.2) provides corrosion management services, the corrosion management bar component (164.2) may begin to corrode. Consequently, visual appearance the corrosion management bar component (164.2) may change in a way that is offensive to persons viewing the chassis.

In one or more embodiments of the invention, the corrosion management bar component (164.2) includes an active portion (164.6). The active portion (164.6) may be formed from metal or the material that provides the corrosion management services.

To mitigate the change in the visual appearance of the active portion (164.6), the corrosion management bar component (164.2) may include a partial encapsulation layer (164.4). The partial encapsulation layer (164.4) may encapsulate a portion of the active portion (164.6). The partial encapsulation layer (164.4) may prevent an ambient environment interacting with encapsulated portion of the active portion (164.6).

For example, the partial encapsulation layer (164.4) may be implemented using a polymer film. The polymer film to be disposed in a portion of the active portion (164.6). The polymer film may prevent gases from the ambient environment from interacting with the active portion (164.6). Similarly, the polymer film may prevent humidity from the atmosphere from condensing on the encapsulated portion of the active portion (164.6). Consequently, the portion of the active portion (164.6) encapsulated by the partial encapsulation layer (164.4) may not be subject to corrosion due to the ambient environment.

To mitigate the change in the visual appearance of the active portion (164.6), the corrosion management bar component (164.2) may be installed in the chassis (e.g., mounted to an air receiving exchange) in a manner that only presents the portion of the active portion (164.6) that is encapsulated by the partial encapsulation layer (164.4) to a view of persons outside of the chassis. By doing so, the change in visual appearance of the active portion (164.6) may not be seen through holes in the metal sheet of the air receiving exchange.

In some embodiments of the invention, the partial encapsulation layer (164.4) does not extend to the portion of the active portion (164.6) that is visible through the consumption portal of the air receiving exchange.

While the corrosion management bar component (164.2) has been illustrated as including a limited number of specific features, a corrosion management bar component (164.2) may include similar, different and/or additional features without departing from the invention. Additionally, corrosion management sheet components and corrosion management plug components may also include partial encapsulation layers as discussed with respect to FIG. 1.9.

To further clarify integration of air receding exchanges, a top view diagram of an air receiving exchange (102.2) integrated into a chassis (171) as illustrated in FIG. 1.10.

FIG. 1.10 shows a top view diagram of a chassis (171) in accordance with embodiments of the invention. The chassis may house computing components including, for example, a processor (173), memory modules (174), and traces (177) that interconnect the processor and memory modules. Each of these components may be subject to the downstream impacts corrosion of an air receiving exchange (102.2).

Additionally, each of these components may generate heat when providing their functionality. To manage the heat generated by these components, the chassis (171) may include fans (178). The fans (178) may generate an airflow (180) that extracts the heat generated by the components.

For example, the airflow (180) may draw in gases from an air source (182) into the chassis (171) through the air receiving exchange (102.2). The gases may be at a lower temperature than the processor and memory modules. The gases may pass proximate to the processor, memory modules, and traces to cause thermal exchange with the gases. After thermal exchange, the gases may be expelled out of an air exhausting exchange (102.4). By doing so, the interior of the chassis (171) may be cooled to maintain the temperature of the processor and memory modules within nominal ranges.

However, the airflow (180) may also carry products of corrosion of the air receiving exchange (102.2) towards the processor (173), memory modules (174), and traces (177). These corrosion products may negatively impact the functionality of these components. For example, the corrosion products may create short circuits between traces, may dislodge memory modules from their sockets, and/or may initiate unexpected chemical reactions between the corrosion products and these components.

To manage this corrosion risk, the chassis (171) may include corrosion management components (184) that manage the corrosion of the air receiving exchange (102.2). Additionally, the chassis (171) may include detectors (186) that monitor the corrosion of the air receiving exchange (102.2). For example, the detectors (186) may be used to determine whether the corrosion management components (184) have been exposed to sufficient conditions that they are unlikely to be able to continue to provide corrosion management to the air receiving exchange (102.2) due to their own corrosion. Consequently, the chassis (171) may actively manage the corrosion management components (184) by ascertaining when they should be replaced.

While the chassis (171) has been illustrated as including a limited number of specific components, a chassis in accordance with embodiments of the invention may include additional, different, and/or fewer components without departing from the invention.

To reduce the likelihood of premature failure of IHSs, an IHS in accordance with embodiments of the invention may include an environmental manager. Turning to FIG. 2, FIG. 2 shows a diagram of an environmental manager (200) in accordance with one or more embodiments of the invention. The system environmental manager (130) and/or chassis environmental manager (150) illustrated in FIGS. 1.2 and 1.3, respectively, may be similar to the environmental manager (200).

As discussed above, the environmental manager (200) may provide environmental management services. Environmental management services may reduce the likelihood that IHSs fail prematurely (e.g., prior to meeting service life goals) due to corrosion of the chassis (171).

In one or more embodiments of the invention, the environmental manager (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the environmental manager (200) described through this application and all, or a portion, of the method illustrated in FIG. 3. The environmental manager (200) may be implemented using other types of computing devices without departing from the invention. For additional details regarding computing devices, refer to FIG. 4.

In one or more embodiments of the invention, the environmental manager (200) is implemented using distributed computing devices. As used herein, a distributed computing device refers to functionality provided by a logical device that utilizes the computing resources of one or more separate and/or distinct computing devices. For example, in one or more embodiments of the invention, the environmental manager (200) is implemented using distributed devices that include components distributed across any number of separate and/or distinct computing devices. In such a scenario, the functionality of the environmental manager (200) may be performed by multiple, different computing devices without departing from the invention.

To provide environmental management services, the environmental manager (200) may include an environmental component manager (202) and a storage (204). Each of these components is discussed below.

The environmental component manager (202) may manage the chassis and/or other components that may be used to control the characteristics (e.g., temperature, humidity level, airflow rates, etc.) of the environment of the chassis. To manage them, the environmental component manager (202) may (i) obtain information regarding the environmental conditions including temperatures, humidity levels, airflow rates, and/or corrosion rates, (ii) determine, using the environmental information, whether the IHS is likely to prematurely fail due to corrosion, and (iii) if the IHS is unlikely to meet its service life goals due to premature failure, modify the characteristics of the environment and/or of the chassis to improve the likelihood that the IHS will meet its service life goals.

To obtain information regarding the environmental conditions, the environmental component manager (202) may request such information from computing components (e.g., temperatures), detectors (e.g., corrosion, temperature, humidity, and/or other types of sensors), and/or other types of devices (e.g., components external to the chassis). In response, the aforementioned components may provide the requested information to the environmental component manager (202). The environmental component manager (202) may store the aforementioned information as part of an environmental condition repository (208).

To ascertain whether an IHS is likely to prematurely fail due to corrosion, the environmental component manager (202) may estimate a total amount of corrosion of different portions of a chassis that has likely occurred, estimate the rate that corrosion will occur in the future, and use the previous amount and current rate to determine whether corrosion management components are able to continue to provide corrosion management services sufficient to meet the service life goals of the IHS. To generate the estimates, the environmental component manager (202) take into account environmental conditions and whether any of the portions of the chassis are associated with corrosion management components that may reduce the rates of corrosion of the corresponding components.

Utilizing these estimates, the environmental component manager (202) may determine whether the IHS is unlikely to meet its service life goal due to corrosion. To make this determination, the environmental component manager (202) may utilize a lifecycle repository (212). The lifecycle repository (212) may specify information that may be used to ascertain whether a premature failure will occur based on corrosion. For example, the lifecycle repository (212) may specify a total amount of corrosion that will cause various corrosion management components to no longer be able to provide corrosion management services. Based on this total amount and the corrosion rate associated with the corrosion management component, the environmental component manager (202) may ascertain whether the amount of corrosion specified by the lifecycle repository (212) will be exceeded prior to the occurrence of the service life of the IHS.

If it is determined that the IHS will prematurely fail due to corrosion (e.g., corrosion management components being unable to provide corrosion management services throughout the service life of the IHS), the environmental component manager (202) may orchestrate replacement of one or more corrosion management components. For example, the environmental component manager (202) may notify an administrator of an impending failure of a corrosion management component. In response, the administrator may replace the corrosion management components with a new corrosion management component.

When providing its functionality, the environmental component manager (202) may utilize the storage (204) by storing and using previously stored data structures.

To provide the above noted functionality of the environmental component manager (202), the environmental component manager (202) may perform all, or a portion, of the method illustrated in FIG. 3.

In one or more embodiments of the invention, the environmental component manager (202) is implemented using a hardware device including circuitry. The environmental component manager (202) may be implemented using, for example, a digital signal processor, a field programmable gate array, or an application specific integrated circuit. The environmental component manager (202) may be implemented using other types of hardware devices without departing from the invention.

In one or more embodiments of the invention, the environmental component manager (202) is implemented using computing code stored on a persistent storage that when executed by a processor performs all, or a portion, of the functionality of the environmental component manager (202). The processor may be a hardware processor including circuitry such as, for example, a central processing unit or a microcontroller. The processor may be other types of hardware devices for processing digital information without departing from the invention.

In one or more embodiments disclosed herein, the storage (204) is implemented using devices that provide data storage services (e.g., storing data and providing copies of previously stored data). The devices that provide data storage services may include hardware devices and/or logical devices. For example, storage (204) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (204) may include a memory device (e.g., a dual in line memory device) in which data is stored and from which copies of previously stored data are provided. In another example, storage (204) may include a persistent storage device (e.g., a solid state disk drive) in which data is stored and from which copies of previously stored data are provided. In a still further example, storage (204) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (204) may store data structures including an environmental condition repository (208), a corrosion rate repository (210), and a lifecycle repository (212). Each of these data structures is discussed below.

The environmental condition repository (208) may include one or more data structures that include information regarding the environmental conditions associated with a chassis. For example, when temperature, humidity, airflow rate, and/or corrosion data is read from a detector, the read information may be stored in the environmental condition repository (208). Consequently, a historical record of the environmental conditions in the repository may be maintained.

The environmental condition repository (208) may include any type and quantity of information regarding the environmental conditions within the repository. For example, the environmental condition repository (208) may include temperature sensor data from discrete temperature sensors and/or temperature sensors integrated into computing components (and/or other types of devices). In another example, the environmental condition repository (208) may include corrosion rates from discrete or integrated corrosion sensors (e.g., on board a circuit card). In a still further example, the environmental condition repository (208) may include airflow rate data regarding the flow of gases within a chassis.

In addition to the sensor data, the environmental condition repository (208) may include spatial data regarding the relative locations of portions of a chassis. For example, some portions of a chassis may be disposed away from the detectors. Consequently, it may not be possible to directly measure the temperature, relative humidity level, airflow rates, and/or corrosion of the portions of the chassis. The spatial data may be used to estimate, using measured temperatures and/or corrosion, the likely corrosion rates of the portions of the chassis include, for example, air receiving exchanges that may include corrosion management components disposed on them.

Additionally, the environmental condition repository (208) may include information regarding whether different portions of a chassis are associated with corrosion management components. For portions of chassis that are associated with corrosion management components (e.g., air receiving exchanges), the environmental condition repository (208) may specify correction factors with respect to the rates of corrosion of these portions of the chassis for corresponding environmental conditions. For example, if a portion of a chassis is exposed to a temperature of 70° Fahrenheit and 70% relative humidity, the environmental condition repository (208) may specify that the portion of the chassis has a high rate of corrosion. However, if the portions of the chassis are associated with a corrosion management component, the environmental condition repository (208) may specify a reduction factor that may be applied to the corrosion rate to obtain an estimate of the corrosion rate of the portions of the chassis that takes into account the presence of the corrosion management component.

The environmental condition repository (208) may also include information regarding the rates at which different types of corrosion management components corrode based on different environmental conditions.

The corrosion rate repository (210) may include one or more data structures that include information regarding the rates at which portions of the chassis have corroded. For example, the corrosion rate repository (210) may include tables associated with different portions of the chassis. Each of these tables may include the measured and/or estimated corrosion of these portions.

The tables may also include the time at which the corrosion was measured.

Consequently, the rates of corrosion of the chassis may be ascertained using the information included in the tables (e.g., corrosion at time T1−corrosion at time T2/the different between T1 and T2).

The lifecycle repository (212) may include one or more data structures that include information regarding the desired life of an information handling system. For example, the lifecycle repository (212) may specify how much corrosion may occur with respect to different components (e.g., portions of a chassis, corrosion management components, etc.) before the respective components are likely to fail and/or the IHS is likely to fail due to downstream impacts of corrosion. The aforementioned information may be used in conjunction with determined corrosion rates and quantities of corrosion included in the corrosion rate repository (210) to determine whether it is likely that a component, computing device, and/or IHS is likely to fail prior to its desired service life.

While the data structures stored in storage (204) have been described as including a limited amount of specific information, any of the data structures stored in storage (204) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the environmental manager (200) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the environmental component manager (202). Each of these instances may communicate and cooperate to provide the functionality of the environmental component manager (202).

As discussed above with respect to FIG. 2, the environmental manager (200) may provide corrosion management services. FIG. 3 illustrates a method that may be performed by the environmental manager (200) of FIG. 2 when providing corrosion management services.

FIG. 3 shows a flowchart of a method in accordance with one or more embodiments of the invention. The method depicted in FIG. 3 may be used to manage chassis corrosion in accordance with one or more embodiments of the invention. The method shown in FIG. 3 may be performed by, for example, an environmental manager (e.g., 200, FIG. 2). Other components of the system illustrated in FIGS. 1.1-1.10 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 302, an environmental corrosion risk associated with an air exchange is identified. The air exchange may be an air receiving exchange. The air receiving exchange may be associated with a corrosion management component (i.e., the corrosion management component may provide the air intake exchange with corrosion management services. The environmental corrosion risk may be identified based on detector measurements of the environment in which the air exchange resides. For example, the temperature, relative humidity level, gas flow rate through the air exchange, and/or other conditions that may impact corrosion of the air exchange and associated corrosion management component may be monitored using detectors. These environmental conditions may be used as the environmental corrosion risk.

In step 302, it is determined whether the air exchange is associated with a corrosion management component. The determination may be made based on information included in an environmental condition repository (208, FIG. 2). The environmental condition repository may specify each component that is associated with a corrosion management component. The environmental condition repository may also specify correction factors that are associated with the corrosion management component associated with the air exchange.

If it is determined that the air exchange is not associated with any corrosion management components, the method may proceed to step 304. If it is determined that the air exchange is associated with a corrosion management component, the method may proceed to step 306.

In step 304, a corrosion risk of the air exchange is estimated based on the environmental corrosion risk. For example, the environmental corrosion risk may be associated with corresponding levels of corrosion based on a composition of the air exchange. The association may be determined in a laboratory environment and provided (e.g., stored in storage of or otherwise made available to) to an environmental manager.

For example, the corrosion risk of the air exchange may be functionally related to the environmental corrosion risk. The corrosion risk of the air exchange may be computed by providing the environmental corrosion risk as input to the functional relationship.

Returning to step 302, the method may proceed to step 306 follow step 302 if it is determined that the air exchange is associated with a corrosion management component.

In step 306, a corrosion risk of the air exchange is estimated based on (i) the environmental corrosion risk and (ii) a risk reduction factor associated with the corrosion management component.

As discussed with respect to step 304, the corrosion risk of the air exchange (e.g., how quickly the component is corroding) may be functionally related to the environmental corrosion risk. To take into account the presence of the corrosion management component, a risk reduction factor (e.g., correction factor) may be applied to the output of the functional relationship to obtain the estimate of the corrosion risk of the air exchange. In other words, the corrosion risk of the air exchange based only on the environmental risk may be first calculated. Then, a reduction factor may be applied to obtain the corrosion risk of the air exchange to reflect it being associated (e.g., in direct contact with) with a corrosion management component.

The reduction factor may be based on, for example, the type, material composition, shape, method of integration with the corrosion management component, and/or characteristics of the air exchange (e.g., shape, material composition, etc.). The reduction factor may be determined based on laboratory measurement and may be provided to the environmental manager prior to the performance of the method illustrated in FIG. 3.

In one or more embodiments of the invention, the reduction factor is also calculated based on a useful life of the corrosion management components. For example, as discussed with respect to FIG. 2, the useful life of the corrosion management component associated with the air exchange may be monitored. If it appears that the corrosion management component, based on its previous corrosion exposure and useful life, may not be able to continue to provide corrosion management services, the reduction factor in step 306 may be reduced or nullified. In other words, it may be presumed that the corrosion management component is unable to continue reducing the corrosion to which the air exchange may be subject.

The method may proceed to step 308 follow step 306 and/or step 308.

In step 308, it is determined whether the corrosion risk of the air exchange indicates that its corrosion state is unacceptable. The determination may be made by using the corrosion risk of the air exchange (estimated in step 304 or 306) to determine whether the corrosion of the air exchange is likely to cause an IHS to prematurely fail or corrode in an undesirable manner. For example, it may be assumed that the rate of corrosion indicated by the corrosion risk of the air exchange will remain constant and the duration of time between the current point in time and the future point in time at which the undesirable state is likely to occur may be determined. The future point in time may then be compared to the service life of the IHS to ascertain whether the rate of corrosion will result in a premature failure or otherwise undesirable corrosion level will occur prior to the service life of the IHS being met. The service life of the IHS may be specified by a lifecycle repository.

The determination may be made by comparing the amount of corrosion of the air exchange that has occurred and the corrosion rate of the air exchange to a maximum amount of corrosion that can occur before failure of the IHS or undesirable corrosion state is likely to occur (e.g., the absolute amount of corrosion leading to this undesirable state may be specified in a lifecycle repository). In other words, solving the equation $C_f = C_c + T*C_r$, where $C_f$ is the amount of corrosion that can occur before the undesirable corrosion state is likely to occur, $C_c$ is the amount of corrosion that has already occurred, $C_r$ is the corrosion rate determined in steps 304 and/or 306, and T is the unknown amount of time until the undesired state occurs. If the amount of time until the undesirable state occurs indicates that the undesirable state will occur before the desired service life of the IHS occurs, it is determined that the corrosion rate indicates that the corrosion state of the air exchange is unacceptable.

If it is determined that the corrosion state of the air exchange is unacceptable, the method may proceed to step 310. If it is determined that the corrosion state is acceptable, the method may end following step 308.

In step 310, the corrosion state of the air exchange is remediated. The corrosion state of the air may be remediated by modifying the environmental conditions and/or the chassis itself.

For example, the temperature of gases supplied to the chassis may be increased, the rate of gas flow through the chassis may be decreased, humidity may be removed from the gases supplied to the chassis, and/or other changes to the environment may be made. These changes may be made by modifying operating points of environmental management components.

To modify the operating points of the environmental management components, messages may be sent to the environmental management components indicating that changes are to be made, rates of power supplied to the respective components may be changed (e.g., reduced), and/or other modifications may be made.

The aforementioned changes may be made in a manner that minimizes the consumption of power for such purposes. In other words, a reduction in that amount of corrosion due to these changes may be minimized such that the air exchange is likely to have an acceptable corrosion state based on minimally reduced corrosion.

In one or more embodiments of the invention, the corrosion state of the air exchange is remediated by scheduling the corrosion management component for replacement. For example, the environmental manager may notify an administrator of the IHS of which the chassis is a member that the corrosion management component is to be replaced. The administrator may be notified by sending an electronic message (e.g., instant message, email, etc.) to a computing device or service (e.g., an account of an electronic communication exchange instance) associated with the administrator.

In response, the administrator may replace the corrosion management component. Upon replacement, the environmental manager may be notified of the replacement. Based on the replacement, the environmental manager may update a corrosion rate repository (e.g., 210, FIG. 2) to reflect the corrosion management component is not corroded.

The method may end following step 310.

Using the method illustrated in FIG. 3, embodiments of the invention may provide a system that manages corrosion of a chassis to meet service life goals.

Any of the components of FIG. 2 may be implemented as distributed computing devices. As used herein, a distributed computing device refers to functionality provided by a logical device that utilizes the computing resources of one or more separate and/or distinct computing devices.

Figure 4:
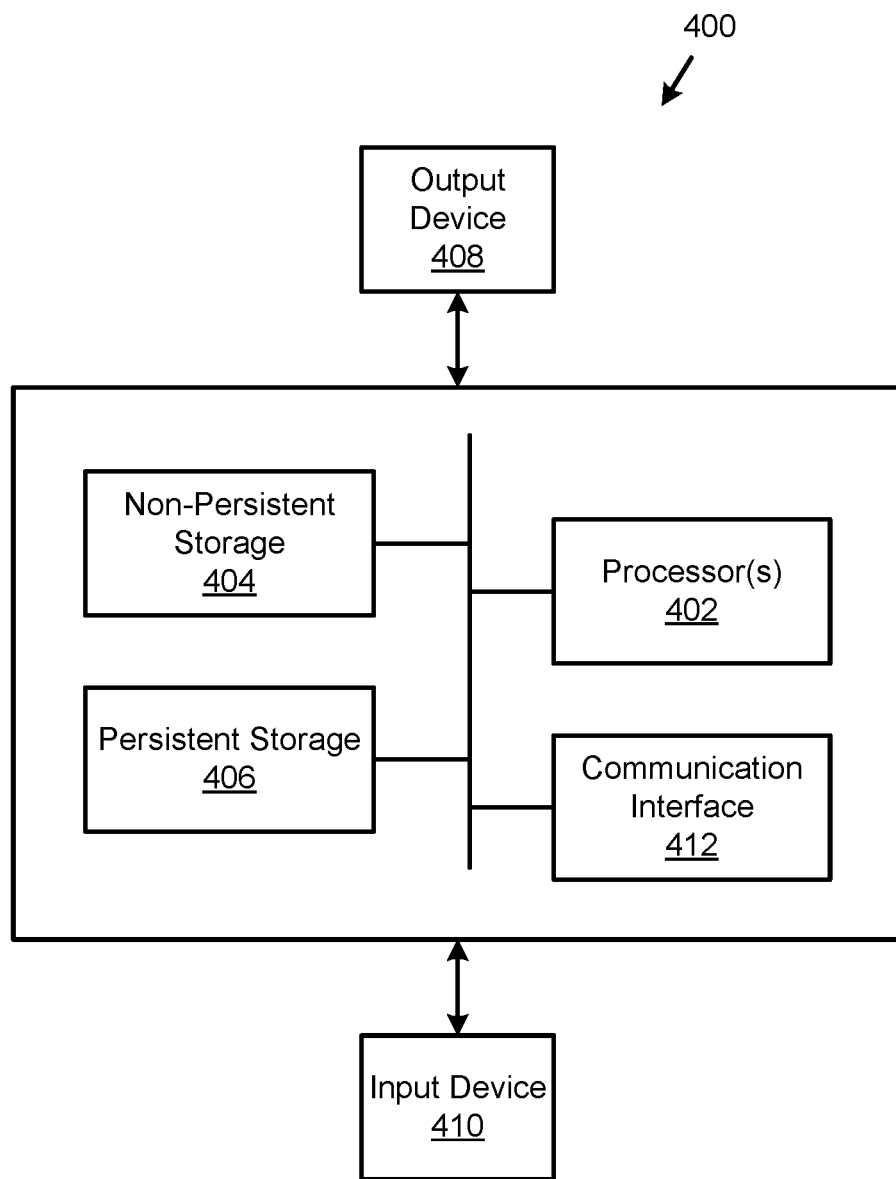
FIG. 4 shows a diagram of a computing device in accordance with one or more embodiments of the invention.

Additionally, as discussed above, embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing components of an information handling system. Specifically, embodiments of the invention may provide a method and device for corrosion of a chassis of an IHS. To do so, embodiments of the invention may provide a system that utilizes corrosion management components to modulate the rates of corrosion of the chassis. The corrosion management components may reduce the rate of corrosion of different portions of the chassis. By doing so, premature failures due to corrosion or other undesirable corrosion related impacts may be mitigated.

Thus, embodiments of the invention may address the problem of environments that may cause undesired corrosion. Specifically, embodiments of the invention may provide a method of managing corrosion that enables less power to be consumed for environmental conditioning purposes while still mitigating the impacts of corrosion.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device of an information handling system, comprising:
   a computing component; and
   a chassis for housing the computing component, comprising:
      an air exchange for receiving gases for thermal management of the computing component, and
      a corrosion management component, physically connected directly to the air exchange, adapted to reduce a rate of corrosion of the air exchange due to the gases, wherein the physical connection between the corrosion management component and the air exchange creates a potential cell between the corrosion management component and the air exchange, and wherein the potential cell reduces a chemical reactivity of the air exchange.

2. The computing device of claim 1, wherein the air exchange comprises:
   a metal sheet, and
   a plurality of holes through the metal sheet adapted to enable the gases to enter the chassis,
   wherein each hole of the plurality of holes through the metal sheet is circumscribed by a cut edge of the metal sheet.

3. The computing device of claim 2, wherein the corrosion management component comprises:
   a galvanic anode, wherein the galvanic anode is attached to a surface of the metal sheet facing an interior of the chassis.

4. The computing device of claim 3, wherein the air exchange further comprises:
   a viewing portal that enables a person outside of the chassis to view a portion of the galvanic anode.

5. The computing device of claim 4, wherein the galvanic anode is adapted to change its appearance as a function of its corrosion level.

6. The computing device of claim 3, wherein the galvanic anode is formed from a metal foam having a shape adapted to extend across at least two holes of the plurality of holes.

7. The computing device of claim 3, wherein the galvanic anode comprises a metal foam having a shape adapted to extend across at least two holes of the plurality of holes.

8. The computing device of claim 3, wherein the galvanic anode comprises a metal bar having a shape adapted to extend across at least two holes of the plurality of holes.

9. The computing device of claim 3, wherein the galvanic anode comprises a metal plug having a shape adapted to be hidden from a view of a person outside of the chassis through any of the plurality of holes.

10. The computing device of claim 1, further comprising:
an environmental manager programmed to:
monitor an environmental corrosion risk associated with the air exchange;
make a determination that the air exchange is associated with the corrosion management component;
in response to the determination:
estimate a corrosion risk of the air exchange based on:
the environmental corrosion risk, and
a risk reduction factor associated with the corrosion management component;
make a second determination that the corrosion risk of the air exchange indicates an unacceptable corrosion state; and
remediate the corrosion risk of the air exchange based on the unacceptable corrosion state.

11. The computing device of claim 10, wherein remediating the corrosion risk of the air exchange comprises:
notifying an administrator of the computing device that the corrosion management component is to be replaced.

12. The computing device of claim 10, wherein the corrosion risk is a risk based on a probability that corrosion of the air exchange will impact a functionality of the computing component.

13. A method for environmentally managing a computing device of an information handling system, comprising:
monitoring an environmental corrosion risk associated with an air exchange of a chassis that houses a computing component of the computing device, wherein a corrosion management component is:
physically connected directly to the air exchange, and
adapted to reduce a rate of corrosion of the air exchange due to gases used to manage a temperature of components of the computing device;
making a determination that the air exchange is associated with the corrosion management component;
in response to the determination:
estimating a corrosion risk of the air exchange based on:
the environmental corrosion risk, and
a risk reduction factor associated with the corrosion management component;
making a second determination that the corrosion risk of the air exchange indicates an unacceptable corrosion state; and
remediating the corrosion risk of the air exchange based on the unacceptable corrosion state.

14. The method of claim 13, wherein remediating the corrosion risk of the air exchange comprises:
notifying an administrator of the computing device that the corrosion management component is to be replaced.

15. The method of claim 13, wherein the corrosion risk is a risk based on a probability that corrosion of the air exchange will impact a functionality of the computing component.

16. A non-transitory computer readable medium comprising computer readable program code, which when executed by a computer processor enables the computer processor to perform a method for environmentally managing a computing device of an information handling system, the method comprising:
monitoring an environmental corrosion risk associated with an air exchange of a chassis that houses a computing component of the computing device, wherein a corrosion management component is:
physically connected directly to the air exchange, and
adapted to reduce a rate of corrosion of the air exchange due to gases used to manage a temperature of components of the computing device;
making a determination that the air exchange is associated with the corrosion management component;
in response to the determination:
estimating a corrosion risk of the air exchange based on:
the environmental corrosion risk, and
a risk reduction factor associated with the corrosion management component;
making a second determination that the corrosion risk of the air exchange indicates an unacceptable corrosion state; and
remediating the corrosion risk of the air exchange based on the unacceptable corrosion state.

17. The non-transitory computer readable medium of claim 16, wherein remediating the corrosion risk of the air exchange comprises:
notifying an administrator of the computing device that the corrosion management component is to be replaced.

18. The non-transitory computer readable medium of claim 16, wherein the corrosion risk is a risk based on a probability that corrosion of the air exchange will impact a functionality of the computing component.

* * * * *